United States Patent [19]

Salour et al.

[11] Patent Number: 4,461,006
[45] Date of Patent: Jul. 17, 1984

[54] SYNCHRONOUSLY PUMPED MODE-LOCKED SEMICONDUCTOR PLATELET LASER

[75] Inventors: Michael M. Salour, Cambridge, Mass.; Charles B. Roxlo, Fanwood, N.J.

[73] Assignee: The United States of America as represented by the Secretary of the Air Force, Washington, D.C.

[21] Appl. No.: 361,019

[22] Filed: Mar. 23, 1982

[51] Int. Cl.$^3$ .............................................. H01S 3/04
[52] U.S. Cl. ...................................... 372/35; 372/43; 372/70
[58] Field of Search ...................... 372/43, 108, 18, 20, 372/35, 107, 70, 100, 34

[56] References Cited

U.S. PATENT DOCUMENTS

| | | | |
|---|---|---|---|
| 3,568,087 | 3/1971 | Phelan et al. | 331/94.5 |
| 3,679,994 | 7/1972 | Ngwyen et al. | 331/94 |
| 3,983,507 | 9/1976 | Tang et al. | 331/94.5 M |
| 3,995,231 | 11/1976 | Johnson et al. | 331/94.5 M |
| 4,173,001 | 10/1979 | Koepf | 331/94.5 C |

OTHER PUBLICATIONS

Roxlo et al., "Optically Pumped Semiconductor Lasers", IEEE *J. of Quantum Electronics,* vol. QE18, No. 3, Mar. 1982, pp. 338–342.
Roxlo et al., "Tunable CW Bulk Semiconductor Platelet Laser", *Applied Physics Letters,* vol. 38, No. 7, Apr. 1, 1981, pp. 507–509.
Rotman et al., "Pulse-Width Stabilization of a Synchronously Pumped Mode-Locked Dye Laser," *Appl. Phys. Lett.,* 36 (11), Jun. 1, 1980, pp. 886–888.

*Primary Examiner*—James W. Davie
*Attorney, Agent, or Firm*—Donald J. Singer; Jacob N. Erlich

[57] ABSTRACT

A synchronously pumped mode-locked semiconductor laser having an actively mode-locked optical pump source and an external resonant cavity. The resonant cavity is bounded by a pair of spaced-apart reflective elements. One of the reflective elements is partially transmissive and mounted for translational movement. The semiconductor crystal is mounted upon the other reflective element and both are mounted within a temperature controlled, vacuum environment while being capable of being moved in three dimensions. Appropriate laser pumping and adjustment of the translational movement of one of the reflective elements of the laser produces an output from the laser in the form of pulses of electromagnetic energy.

14 Claims, 3 Drawing Figures

4,461,006

SYNCHRONOUSLY PUMPED MODE-LOCKED SEMICONDUCTOR PLATELET LASER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to semiconductor lasers and, more particularly, to a synchromously pumped mode-locked semiconductor laser having an external resonant cavity.

Lasers exist in many shapes and forms, yet the search for new types of lasers continues unabated. Lasers vary greatly in many aspects such as, for example, power, operating wavelength, cavity design, method of pumping and mode discipline (mode-locking, single-frequency, or chaotic operation). The single, most frequent means of laser identification is by the type of gain medium utilized within the laser, since the medium will strongly influence, if not dictate, the other considerations of laser design.

Heretofore, actively mode-locked dye lasers have been widely utilized for the study of, for example, ultrafast events which occur on picosecond time scales. Unfortunately, ultrashort mode-locked pulses can propagate through the dye laser cavity only if their round-trip travel time is perfectly matched to the repetition rate of the pump laser. Therefore, these parameters are of crucial importance in determining pulse width. In addition, noise due to pump laser plasma instabilities, dye jet fluctuation and thermal expansion poses severe difficulties in laser operation.

The above problems have been somewhat alleviated by the introduction of an active feedback circuit into the dye laser system. This feedback circuit is utilized with both the laser pulse repetition rate and the dye laser cavity length in the manner discussed in a paper co-authored by the inventors with S. R. Rotman and D. Babelaar entitled "Pulse-width stabilization of a synchronously pumped mode-locked dye laser," *Appl. Phys. Lett.*, 36 (11), June 1, 1980. However, as is readily apparent, proper adjustment of the cavity length is still crucial. In fact, changes of only microns can drastically alter the pulse shape without affecting the total output power. It would therefore be particularly beneficial to provide a synchronously pumped mode-locked laser which is not subject to the severe restrictions and complex circuitry associated with past mode-locked lasers.

SUMMARY OF THE INVENTION

The present invention overcomes the problems encountered in the past and as set forth in detail hereinabove by providing a synchronously pumped mode-locked semiconductor laser having an external resonant cavity in which the cavity can be varied by hundreds of microns without adversly affecting the output pulse width.

The synchronously pumped mode-locked semiconductor laser of this invention relies mainly upon the use of an external resonant cavity, an actively mode-locked pump laser, and a partially transmissive output mirror capable of translational movement for its reliable operation. The cavity configuration utilized with this invention is similar to that described in U.S. patent application Ser. No. 361,021 entitled Tunable CW Semiconductor Platelet Laser filed together with the present patent application on Mar. 23, 1982 by the inventors.

More specifically, the instant invention utilizes a semiconductor crystal in the form of, for example, a cadmium sulfide platelet crystal which is mounted on one side thereof to a support in the form of, for example, a piece of sapphire. The same side of the sapphire to which the semiconductor platelet is secured is also dielectrically coated with a maximum reflectivity mirror. This mirror acts as one end of the external resonant cavity of the laser of this invention. Completing the other end of the resonant cavity is a 99.5% reflecting output mirror mounted for translational movement and which is optically aligned with the sapphire mirror.

Optically interposed between the two end reflective surfaces or mirrors of the external cavity is a polarizing beamsplitter which allows for the introduction of an optical pump beam from a suitable actively mode-locked optical source, such as a pulsed $AR^+$ laser. The pump beam is focused onto the crystal platelet to a spot size of approximately 5 micrometers by a 10X microscope objective which also serves to collimate the crystal fluorescence.

It is essential in this invention that the sapphire end mirror and semiconductor platelet crystal lasing medium be located within a cooling chamber for appropriate lasing action to take place. In addition, since the distance between the microscope objective and crystal is small ($\sim 7$ mm) the microscope objective must also be placed within the cooling chamber.

The sapphire end mirror is held in place within the cooling chamber by a uniquely designed mount. Liquid nitrogen is thermally connected to the crystal/sapphire mount for cooling purposes. Also located within the vacuum/cooling chamber are other suitable mounts which permit movement of the sapphire end mirror and semiconductor platelet in three dimensions so that spots on different crystals can be utilized, the objective can be brought into focus, and proper alignment of the resonant cavity can be made.

By appropriate adjustment of the output mirror in order to substantially match the length of the external resonant cavity to the cavity length of the pumping laser (i.e., to substantially match the repetition rate of the pump pulses), output pulses as short as 8 ps can be obtained. In contrast to synchronously pumped dye lasers, the external resonant cavity of the instant invention can be varied by hundreds of microns without adversely affecting the pulse width, thereby indicating that passive pulse shaping may be taking place. In the laser of the present invention lasing occurs over a range of cavity lengths of approximately 1 mm. It is also possible with the synchronously pumped mode-locked laser of this invention to provide direct tuning by the use of an intercavity prism and rotatable output mirror in the manner set forth in U.S. patent application Ser. No. 361,021 referred to hereinabove.

It is therefore an object of this invention to provide a synchronously pumped mode-locked semiconductor laser having an external cavity.

It is also an object of this invention to provide a synchronously pumped mode-locked tunable semiconductor laser having an external cavity.

It is another object of this invention to provide a synchronously pumped mode-locked semiconductor laser which permits fine adjustment of the resonant cavity to take place.

It is still another object of this invention to provide a synchronously pumped mode-locked semiconductor laser in which the length of the resonant cavity can be varied without adversely affecting pulse width.

It is still a further object of this invention to provide a synchronously pumped mode-locked semiconductor laser which is economical to produce and which utilizes conventional, currently available components that lend themselves to standard, mass producing, manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

Figure 1:
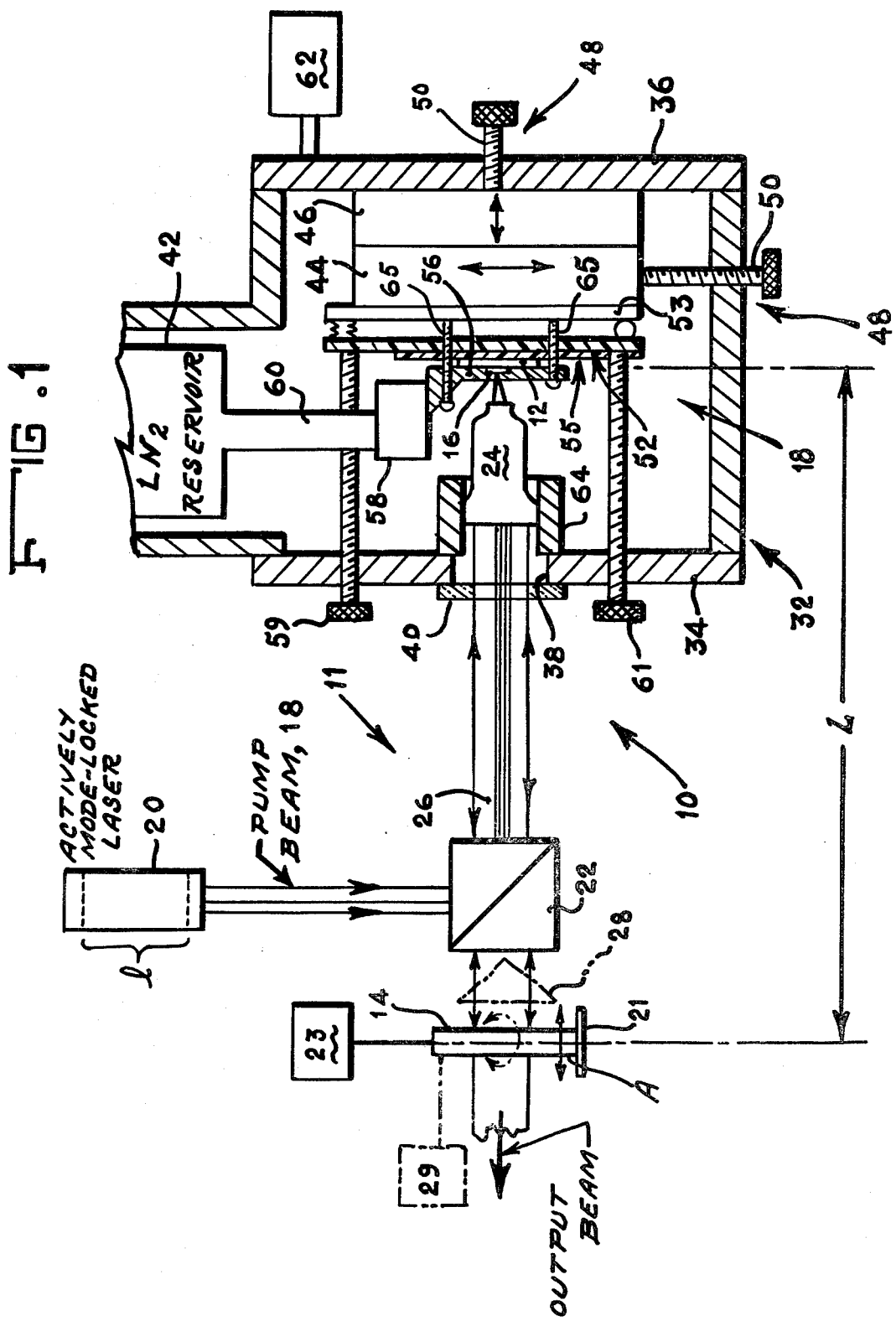
Figure 3:
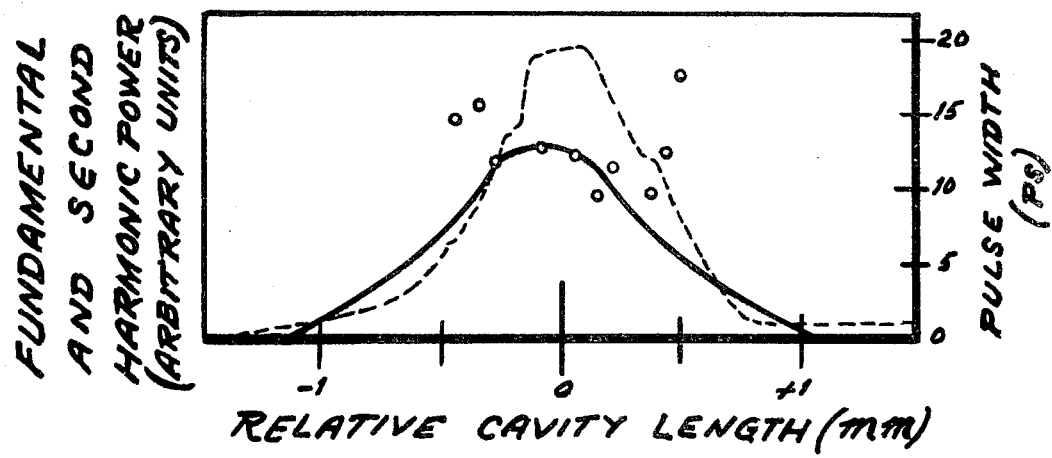
Figure 2:
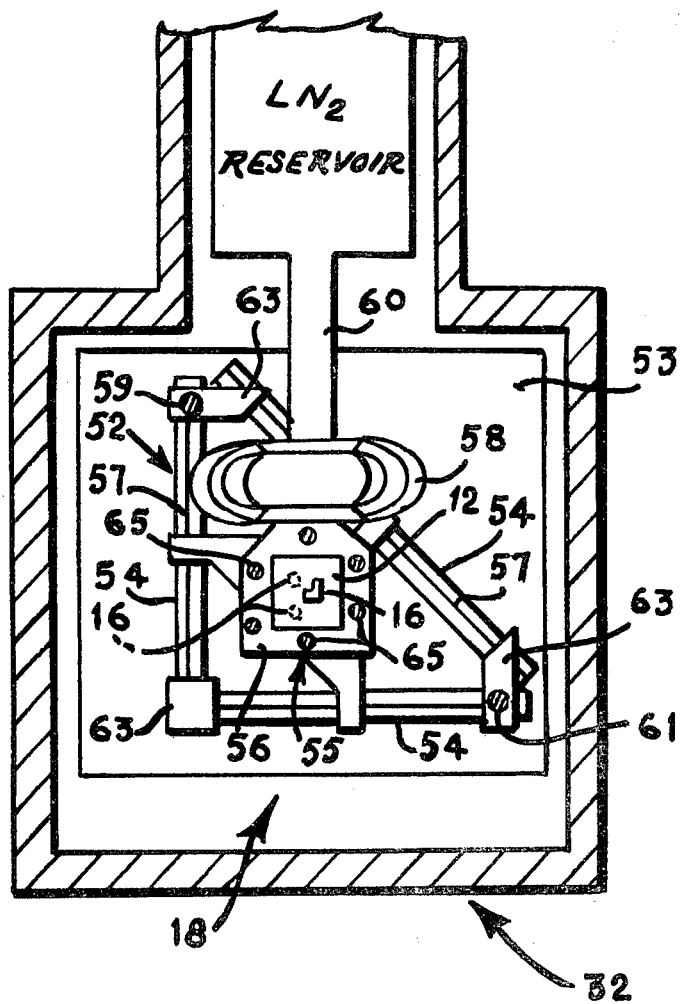

FIG. 1 is a side elevational view of the synchronously pumped mode-locked semiconductor laser of this invention shown partially in cross-section and schematic fashion;

FIG. 2 is a front view, shown partly in cross section, schematically illustrating the various components within the vacuum cooling chamber of the synchronously pumped mode-locked semiconductor laser of this invention; and FIG. 3 is a graphic representation of the dependance of laser output power and peak second harmonic power on the relative resonant cavity length within the synchronously pumped mode-locked semiconductor laser of this invention.

DETAILED DESCRIPTION OF THE PREFERRED EMBODIMENT

Reference is now made to FIG. 1 of the drawing which clearly illustrates in schematic fashion the various components which make up the synchronously pumped mode-locked semiconductor laser 10 of this invention. Laser 10 of the present invention incorporates therein an external resonant cavity 11. Resonant cavity 11 is bounded at one end thereof by a first reflective element 12 in the form of, for example, a piece of sapphire being dielectrically coated on one side thereof with a maximum reflectivity mirror. The other end of the resonant cavity 11 is formed by a partially reflective, output element in the form of, for example, mirror 14 preferably having a 99.5% reflectivity and being movable in a direction along the optical axis of resonant cavity in a direction indicated by arrow A in FIG. 1.

The lasing medium of this invention is made up of a very thin (<5 μm) semiconductor crystal 16 such as cadmium sulfide (CdS), $CdS_xSe_{1-x}$ or $In_{1-x}Ga_x$-$As_yP_{1-y}$ which is chosen for flatness and parallism by observing under a microscope the interference patterns created by a sodium lamp. The semiconductor crystal 16 is mounted upon the reflective surface of sapphire 12 using a thin film of low viscosity silicone oil applied on sapphire 12 next to crystal 16. Semiconductor crystal 16 held in place on sapphire 16 by surface tension. The oil layer is often less than 5 micrometers thick and does not crack when cooled. The crystal-mirror sandwich is held in place within a vacuum/cooling chamber 18 for movement in three dimensions. This movement includes translational movement along the x, y axes as well as two tilting directions about the z axis in a manner to be explained in detail hereinbelow.

The lasing medium or semiconductor crystal 16 is optically pumped longitudinally by a pulsing laser beam 18 emanating from any suitable actively mode-locked laser source 20 such as a pulsed Ar+ laser. Such a laser 20 has a resonant cavity of predetermined length, l, for example, approximately 1.8 m and produces ~100 ps pulses on the 476 nm line at a repetition rate of 82 MHz. The resonant cavity length, L, of laser 10 is set to substantially match the 1.8 length, l, of the pumping laser 20 by moving output mirror 14 by means of a conventional translational stage 21. This translational movement may be performed either manually or by any conventional drive means such as motor 23. The cavity length can be varied ±1 mm without adversely affecting pulse width within the semiconductor laser 10 of this invention.

Pump beam 18 is directed into the resonant cavity 11 by a conventional polarizing beamsplitter 22 located therein. Focusing of pump beam 18 onto crystal 16 to a spot size of approximately 5 micrometers is accomplished by means of a conventional 10X microscope objective 24 which is adjustably positioned within vacuum/cooling chamber 18.

The laser beam 26 produced by semiconductor laser 10 of this invention is separated from pump beam 18 by polarizing beamsplitter 22 which transmits 98% of the CdS emission. In order to make this possible, the c-axis of the CdS crystal 16 is vertically oriented. Then its fluorescense which primarily has E⊥c, is polarized perpendicularly to the vertically polarized optically pumping laser beam 18.

It is also possible with the present invention to locate a prism 28 (shown in phantom) within the resonant cavity 11 and include means 29 (also shown in phantom) for rotating output mirror 14 in a manner described in U.S. patent application Ser. No. 361,021 referred to hereinabove. In this manner, the output beam be tuned appropriately rotating output mirror 14 about its vertical axis.

Reference is now made to the vacuum/cooling chamber 18 shown in both FIGS. 1 and 2 of the drawing. It is essential in the synchronously pumped mode-locked semiconductor laser 10 of this invention to locate the lasing medium, that is, semiconductor crystal 16, in a vacuum in which cooling thereof can take place. The vacuum/cooling chamber 18 forming part of this invention is not only capable of accommodating crystal 16 under the appropriate temperature conditions, but is also capable of moving crystal 16 along the x-y axis as well as tilting crystal 16 about the z axis.

More specifically, vacuum/cooling chamber 18 is made up of a housing 32 preferably being of a tubular configuration having a substantially square cross section as shown in FIG. 2 of the drawing. Although not limited to the following dimensions, optimum outputs can be obtained with laser 10 of this invention with chamber 18 being a stainless steel tube having a square cross-section approximately 15×15 centimeters by 11 centimeters in length having a 1.0 centimeter wall thickness.

A pair of end plates 34 and 36 seal the tube with one of the end plates 34 having a centrally located opening 38 therein covered by a transparent material 40, transparent to the wavelengths of interest so as to permit passage therethrough of both the optical pumping beam 18 and laser beam 26. Any conventional coolant reservoir 42 is situated on top of the housing 32 and preferably contains liquid nitrogen which is used for cooling purposes. Both the microscope objective 24 and the crystal/mirror sandwich are located within the confines of the vacuum/cooling chamber 18 in a manner to be described in detail hereinbelow.

Reference is once again made to FIGS. 1 and 2 of the drawing for a detailed description of the cooling and mounting arrangement for crystal 16. Two translational stages 44 and 46, preferably in the form of Klinger model MRS 80 25 are secured to back plate 36 of chamber 18 and crystal/sapphire sandwich described below to allow the translational movement of the crystal/mirror sandwich to take place in the directions indicated by the arrows shown in FIG. 1. These translational stages 44 and 46 are controlled by conventional micrometer heads 48 located outside of chamber 18 and which protrude through the walls of vacuum/cooling chamber 18. The spindles 50 of the micrometer heads 48 are pushed directly against the respective sides of translational stages 44 and 46 so as to allow the appropriate movement of the crystal/mirror sandwich with micron accuracy.

Crystal 16 and sapphire 12 are centrally located and optically aligned with the laser and pumping beams 18 and 26, respectively, and held in position by mounting assembly 52 and a mounting plate 53 preferably made of steel. As clearly illustrated in FIG. 2, mounting assembly 52 is in the form of a triangular-shaped structure supported by mounting plate 53 for slight movement therewith with respect to housing 32. The triangular structure includes a plurality of quartz tubing 54 and a quartz central support 55 slidably mounted thereon for coarse adjustment. Mounting assembly 52 can be tilted in two directions with respect to plate 53 by turning a pair of screws 59 and 61 located at the corners of mounting assembly 52 as shown in FIG. 1. The screws are connected to vacuum feedthroughs with electroformed nickel bellows (not shown) and can be adjusted while the laser is in operation. Quartz tubing is used for the material of mounting assembly 52 because it exhibits low thermal conductivity and very low thermal expansion, minimizing stresses generated when crystal 16 is cooled down. As shown in FIG. 2, three pieces of quartz tubing 54 are interconnected by stainless steel connectors 63 to complete mounting assembly 52.

Sapphire mirror 12 is clamped to the quartz crystal support 55 by a stiff copper ring 56 and a plurality of screws 65. A thin sheet of indium (not shown) may be provided between sapphire mirror 12 and copper ring 56 in order to insure a good thermal connection therebetween. The stiff copper support ring 56 is soft soldered to a flexible copper loop 58 which is made up of approximately 20 wraps of thin copper sheet. This loop 58 allows transverse movement of mounting plate 55 and crystal 16 to take place by more than 1.5 cm in both directions.

More specifically, loop 58 is made up of a spiral of a single piece of copper 250 cm × 2.5 cm × 50 μm brazed together at the top and bottom. The top of the loop 58 is connected to a hollow cold finger 60 operably connected to the liquid nitrogen reservoir 42. It is possible, if so desired, to loosely surround the quartz triangular shaped mounting assembly 52 and copper loop 58 by three layers of "super-insulation" such as aluminized Mylar foil in order to reduce radiated heat losses.

The vacuum-cooling chamber 18 can be pumped to a pressure of 20 m torr before lasing operation commences by any conventional vacuum pump 62. A charcoal dessicant further reduces convection losses. Temperature on mounting assembly 52 can be measured by 3 platinum RTD detectors (not shown) if desired.

The microscope objective 24 (Leitz EF 10/.25P) located within vacuum/cooling chamber 18 is chosen for its relatively low reflection losses, roughly approximately 4% per pass. It is slidably connected by means of outstanding element 64 to front plate 34 of chamber 18. Objective 24 can be moved parallel to the beam 26 for appropriate focusing onto crystal 16 by any conventional means (not shown). Typically, lasing can be accomplished over a range of 200 μm in the focal distance for a cavity length 1.8 meters.

The vacuum/cooling chamber 18 maintains crystal 16 at a stable temperature of approximately 82 K. It is capable of cooling down from room temperature in approximately ten minutes, and the 380 ml capacity of the liquid nitrogen reservoir 42 is sufficient to hold the temperature substantially constant for over six hours without refilling.

Modelocking laser 10 using synchronous pumping by laser 20 can produce output pulses as short as 4 ps with energy conversion efficiencies of 20%. In fact, modelocked pulses with time-bandwidth products as low as 1.7 can be achieved.

The output of laser 10 can be determined by means of a conventional Michelson-type autocorrelator (not shown) which utilizes second harmonic generation in a lithium formate crystal to measure pulse width. Although the power and pulse width may vary from spot to spot on crystal 16, lasing can be achieved almost anywhere. Thresholds as low as 17 mW using a 30% transmitting output coupler are possible. Typical spots on crystal 16 can yield stable 10–12 ps pulses with 3–5 mW output power and 50 mW of pump power. Outputs into the $TEM_{oo}$ mode with beam width as small as 1 mm at output mirror 14 can be easily achieved.

A 50% transmitting output coupler could also be used with the present invention in order to produce higher output with comparable pulse widths. Power conversion efficiencies of over 12% could be typical in such an arrangement. Up to 26 mW of output power could be maintained for a short while without damaging crystal 16 using 177 mW of input.

As is clearly illustrated in FIG. 3 of the drawing, the output power (solid line) and peak second harmonic power (dashed line) are shown relative to cavity length. As illustrated therein, the synchronously pumped mode-locked semiconductor laser 10 of this invention performs substantially different than the synchronously pumped dye lasers of the past in which proper adjustment of cavity length is crucial and in which changes of only microns can drastically alter the pulse shape. In semiconductor laser 10, lasing occurs over a range in cavity length, L, of approximately 1 mm.

The dots in FIG. 3 represent the output pulse width at various cavity lengths as measured by autocorrelation assuming a single sided exponential. The power of the second harmonic, which should be proportional to the fundamental power squared divided by the pulse width, can be seen in the graph of FIG. 3 to roughly follow the fundamental curve, although it peaks at a slightly longer cavity length.

Clearly laser 10 differs from past dye lasers in many aspects, for example, amplified spontaneous emission can easily occur with this invention. Only one pass is made through the gain medium per round trip, as in a ring laser. Also the crystal-mirror sandwich forms a Fabry-Perot etalon which restricts the bandwidth. The bandwidth of the etalon is typically less than 0.5 nm ($\Delta\nu < 600$ GHz) with a finesse that is higher than the wedge or birefringent filter normally used in dye lasers. Because the pulse width achieved is dependent on the intracavity bandwidth, it is possible that an increase in this bandwidth will allow the generation of shorter pulses. This could be accomplished by an antireflection coating on the front surface of crystal 16.

Although this invention has been described with reference to a particular embodiment, it will be understood that this invention is also capable of further and other embodiments within the spirit and scope of the appended claims.

We claim:

1. A synchronously pumped mode-locked semiconductor laser comprising:
    a resonant cavity having a first reflective element being partially transmissive at one end thereof and a second reflective element being substantially totally reflective optically aligned with said first reflective element at the other end thereof, said first reflective element being mounted for translational movement;
    a semiconductor lasing medium mounted adjacent said second reflective element within said resonant cavity;
    means for providing an actively mode-locked beam of electromagnetic radiation for pumping said laser;
    means operably connected to said first reflective element for moving said first reflective element in translation in order to adjust the length of said resonant cavity;
    means optically interposed within said resonant cavity for directing said pump beam into said resonant cavity and for passing an output laser beam therethrough;
    means for providing a vacuum and temperature controlled environment surrounding said semiconductor lasing medium and said second reflective element; and
    means optically interposed within said resonant cavity for focusing said pump beam onto said semiconductor lasing medium;
    whereby said pump beam initiates lasing action within said resonant cavity and said laser beam outputs from said resonant cavity through said first reflective element in the form of pulses of electromagnetic energy.

2. A synchronously pumped mode-locked semiconductor laser as defined in claim 1 wherein said pumping means comprises an actively mode-locked laser, said pump laser having a resonant cavity of preselected length, and said length of said resonant cavity of said semiconductor laser being adjusted by means of said means for moving said first reflective element to within approximately ±1 mm of said preselected length of said pump laser resonant cavity.

3. A synchronously pumped mode-locked semiconductor laser as defined in claim 2 further comprising a prism optically interposed within said resonant cavity of said semiconductor laser, and means operably connected to said first reflective element for rotating said first reflective element about its vertical axis thereby enabling said semiconductor laser to be tuned.

4. A synchronously pumped mode-locked semiconductor laser as defined in claim 2 further comprising means for moving said semiconductor lasing medium and said second reflective element in three dimensions.

5. A synchronously pumped mode-locked semiconductor laser as defined in claim 4 wherein said vacuum and temperature controlled environment providing means comprises a housing, means operably connected to the interior of said housing for providing a vacuum therein, and means operably connected to said second reflective element for controlling the temperature of said semiconductor lasing medium and said second reflective element.

6. A synchronously pumped mode-locked semiconductor laser as defined in claim 5 wherein said focusing means is adjustably mounted within said housing.

7. A synchronously pumped mode-locked semiconductor laser as defined in claim 6 wherein said temperature controlling means comprises a source of coolant and means for thermally connecting said coolant to said second reflective element.

8. A synchronously pumped mode-locked semiconductor laser as defined in claim 7 wherein said coolant connecting means comprises a coiled loop of conductive material.

9. A synchronously pumped mode-locked semiconductor laser as defined in claim 3 further comprising means for moving said semiconductor lasing medium and said second reflective element in three dimensions.

10. A synchronously pumped mode-locked semiconductor laser as defined in claim 9 wherein said three dimensions include translational movement along the x, y axes and tilting movement along the z axis.

11. A synchronously pumped mode-locked semiconductor laser as defined in claim 10 wherein said vacuum and temperature controlled environment providing means comprises a housing, means operably connected to the interior of said housing for providing a vacuum therein, and means operably connected to said second reflective element for controlling the temperature of said semiconductor lasing medium and said second reflective element.

12. A synchronously pumped mode-locked semiconductor laser as defined in claim 11 wherein said focusing means is adjustably mounted within said housing.

13. A synchronously pumped mode-locked semiconductor laser as defined in claim 12 wherein said semiconductor lasing medium comprises a cadmium sulfide crystal platelet.

14. A synchronously pumped mode-locked semiconductor laser as defined in claim 13 wherein said second reflective element is in the form of a piece of sapphire.

* * * * *